(12) United States Patent
Cohen Gadol (10) Patent No.: US 9,702,918 B2
(45) Date of Patent: Jul. 11, 2017

(54) ELECTROMAGNETIC RADIATION DETECTING SYSTEM AND METHOD

(71) Applicant: Moshe Cohen Gadol, Ramat Gan (IL)

(72) Inventor: Moshe Cohen Gadol, Ramat Gan (IL)

(*) Notice: Subject to any disclaimer, the term of this patent is extended or adjusted under 35 U.S.C. 154(b) by 6 days.

(21) Appl. No.: 14/634,926

(22) Filed: Mar. 2, 2015

(65) Prior Publication Data

US 2015/0253371 A1 Sep. 10, 2015

Related U.S. Application Data (60) Provisional application No. 61/950,108, filed on Mar. 9, 2014.

(51) Int. Cl.
| | | |
|---|---|---|
| *G01R 27/28* | (2006.01) | |
| *G01R 31/02* | (2006.01) | |
| *G01R 1/07* | (2006.01) | |
| *G01R 31/00* | (2006.01) | |
| *G01M 1/00* | (2006.01) | |
| *H02H 1/00* | (2006.01) | |
| *H02J 1/00* | (2006.01) | |
| *G01R 29/08* | (2006.01) | |

(52) U.S. Cl.
CPC .......... *G01R 31/021* (2013.01); *G01R 1/07* (2013.01); *G01R 31/001* (2013.01); *G01M 1/00* (2013.01); *G01R 29/0814* (2013.01); *H02H 1/00* (2013.01); *H02J 1/00* (2013.01)

(58) Field of Classification Search
CPC .............. H02H 1/00; H02J 1/00; G01M 1/00
See application file for complete search history.

(56) References Cited

U.S. PATENT DOCUMENTS

| | | | | |
|---|---|---|---|---|
| 3,857,069 A | * | 12/1974 | Howell | H02H 3/331 361/45 |
| 4,385,301 A | * | 5/1983 | Tricoles | G01S 5/02 342/445 |
| 5,912,554 A | * | 6/1999 | Saito | G01R 29/0814 324/95 |
| 2003/0080277 A1 | * | 5/2003 | Bauer, Jr. | G01R 29/0814 250/205 |
| 2003/0206111 A1 | * | 11/2003 | Gao | G01R 31/1272 340/635 |
| 2004/0070535 A1 | * | 4/2004 | Olsson | G01S 7/03 342/459 |
| 2008/0057767 A1 | * | 3/2008 | O'Rourke | H01R 31/02 439/345 |

(Continued)

FOREIGN PATENT DOCUMENTS

| | | |
|---|---|---|
| CN | 103149412 | 6/2013 |
| EP | 0736776 | 10/1996 |

*Primary Examiner* — Jermele M Hollington
*Assistant Examiner* — Temilade Rhodes-Vivour
(74) *Attorney, Agent, or Firm* — Edward Langer (57) ABSTRACT

An electromagnetic radiation detecting system within an electric system, the electromagnetic radiation detecting system comprising: a plurality of induction rings, each for surrounding one of a plurality of electric lines of the electric system; and a controller connected to the plurality of induction rings, for measuring voltages produced by the plurality of induction rings, and for indicating, from the measuring, electric lines corresponding to induction rings having non-zero sum total electric current flows, thereby indicating the electric lines as being electromagnetic radiation pollution sources.

7 Claims, 7 Drawing Sheets

(56) References Cited

U.S. PATENT DOCUMENTS

2013/0262003 A1\* 10/2013 Simper .............. G01R 19/0092
   702/64
2014/0049264 A1\* 2/2014 Ganesh ................ G01R 31/025
   324/551
2014/0139956 A1\* 5/2014 Ward ..................... H02H 3/335
   361/45
2014/0368351 A1\* 12/2014 Coutelou ............... G01D 4/002
   340/870.02

\* cited by examiner

ELECTROMAGNETIC RADIATION DETECTING SYSTEM AND METHOD

CROSS-REFERENCE TO RELATED APPLICATIONS

This application claims the benefit of priority from U.S. Provisional Patent Application No. 61/950,108, filed Mar. 9, 2014, which is incorporated herein by reference in its entirety.

TECHNICAL FIELD

The invention relates to the field of electricity systems. More particularly, the invention relates to a method and apparatus for detecting wiring failures and electromagnetic radiation produced thereby.

BACKGROUND

Electrical systems and infrastructure might emit electromagnetic radiation. This radiation is considered hazardous to human beings.

Standards define the maximum allowable daily radiation as around 2-4 miligauss. In many electrical and infrastructure systems, the radiation level greatly exceeds the permissible amount. In electrical distribution boards, high tension transformers, and electric cables, for example, the radiation level can reach hundreds of miligauss at close range. As the distance from this electrical infrastructure increases, the level of hazardous radiation decreases approximately in proportion to the square of the distance. Human beings within range of the danger do not feel and are not aware of the radiation and the resulting health hazard.

The current solutions include testing electromagnetism by an authorized examiner of the electromagnetic fields at every point where a person is located. These tests are conducted periodically in places that are aware of the testing. The problem with this method is that by the time a hazardous level of radiation is detected, it is liable to be too late for a person who has been exposed to it. It is also difficult to trace the source of the radiation.

The purpose of the current invention is to solve these problems.

A residual-current device (RCD) includes a sensing coil being a differential current transformer which surrounds (but is not electrically connected to) the live and neutral conductors. In normal operation, all the current down the live conductor returns up the neutral conductor. The currents in the two conductors are therefore equal and opposite, thus the radiation of both, cancel each other.

For a RCD used with three-phase power, all three live conductors and the return conductor must pass through the current transformer.

However, the RCD is not intended to solve the problems of the system, but rather to cut out the supply once detecting a leak of a certain consumer.

Further, the RCD is designed for detecting electric flow crossing a single cable only. The RCD is used for detecting high intensity dripping, and where the resistance of the ground is high. The RCD is designed to prevent electrocution, not electromagnetic radiation.

SUMMARY

In one aspect of the invention the invention provides a method and apparatus for detecting the areas having undesired electromagnetic radiation.

In another aspect of the invention the invention provides a solution to the above-mentioned and other problems of the prior art.

In one aspect, the invention is directed to an electromagnetic radiation detecting system within an electric system, the electromagnetic radiation detecting system comprising:
 a plurality of induction rings, each for surrounding one of a plurality of electric lines of the electric system; and
 a controller connected to the plurality of induction rings, for measuring voltages produced by the plurality of induction rings, and for indicating, from the measuring, electric lines corresponding to induction rings having non-zero sum total electric current flows,
thereby indicating the electric lines as being electromagnetic radiation pollution sources.

The reference numbers have been used to point out elements in the embodiments described and illustrated herein, in order to facilitate the understanding of the invention. They are meant to be merely illustrative, and not limiting. Also, the foregoing embodiments of the invention have been described and illustrated in conjunction with systems and methods thereof, which are meant to be merely illustrative, and not limiting.

BRIEF DESCRIPTION OF DRAWINGS

Embodiments, features, and aspects of the invention are described herein in conjunction with the following drawings.

The drawings are not necessarily drawn to scale.

DETAILED DESCRIPTION

The invention will be understood from the following detailed description of embodiments thereof, which are meant to be descriptive and not limiting. For the sake of brevity, some well-known features, methods, systems, procedures, components, circuits, and so on, are not described in detail.

Figure 1:
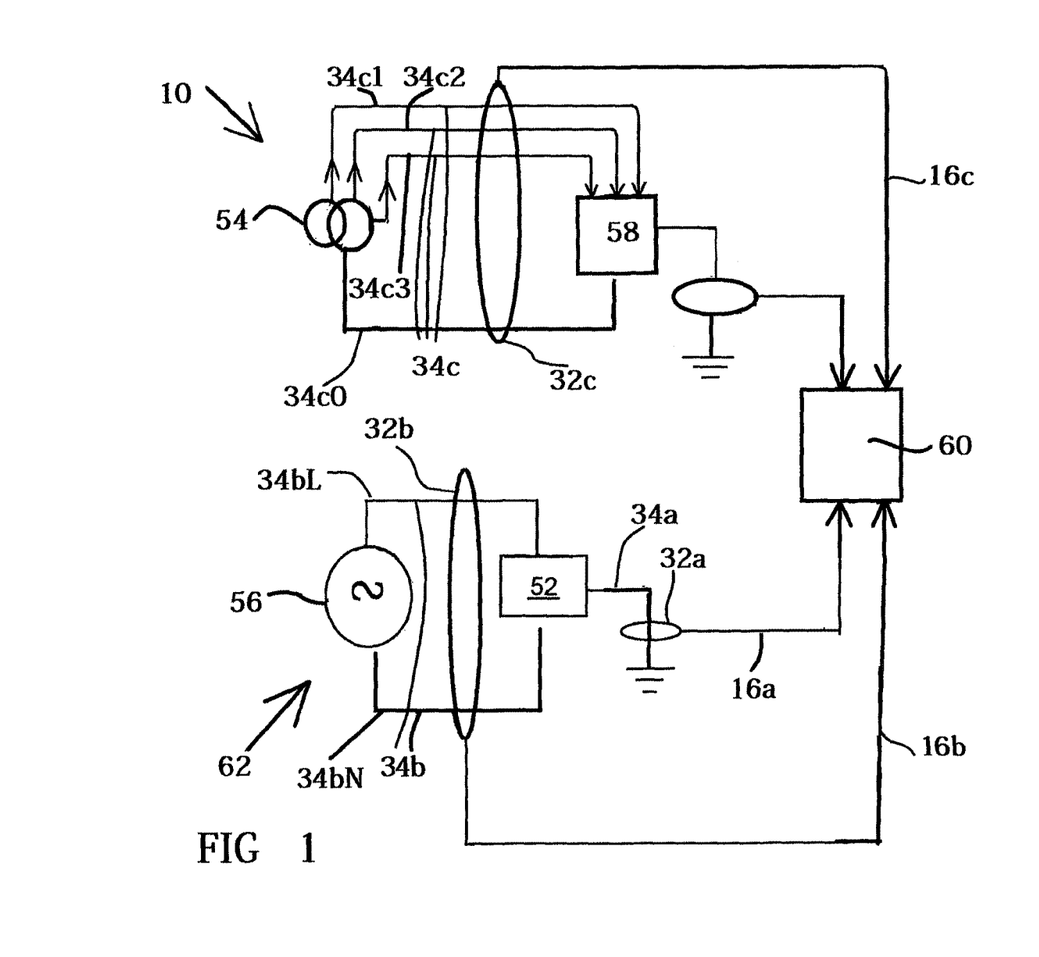
FIG. 1 depicts an electromagnetic radiation detecting system according to one embodiment of the invention.

FIG. 1 depicts an electromagnetic radiation detecting system according to one embodiment of the invention.

An electromagnetic radiation detecting system 10 in an electric system 62 includes a plurality of induction rings 32a, 32b, and 32c, each for surrounding one of a plurality of electric lines 34a, 34b, and 34c respectively, for transferring the measuring lines 16a, 16b, and 16c respectively produced by the respective induction rings 32a, 32b, and 32c, to an integrated volt meter 64.

Figure 2:
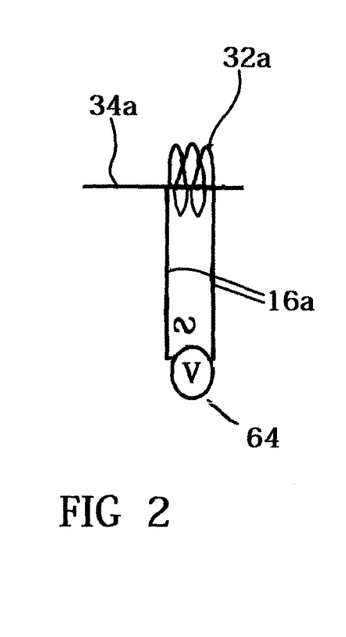
FIG. 2 is an electric diagram of one of the induction rings of FIG. 1.

FIG. 2 is an electric diagram of one of the induction rings of FIG. 1.

Measuring line 16a, for example, includes two ends of induction ring 32a, surrounding electric line 34a. The voltage between the two ends may be measured by a volt meter 64.

Figure 3:
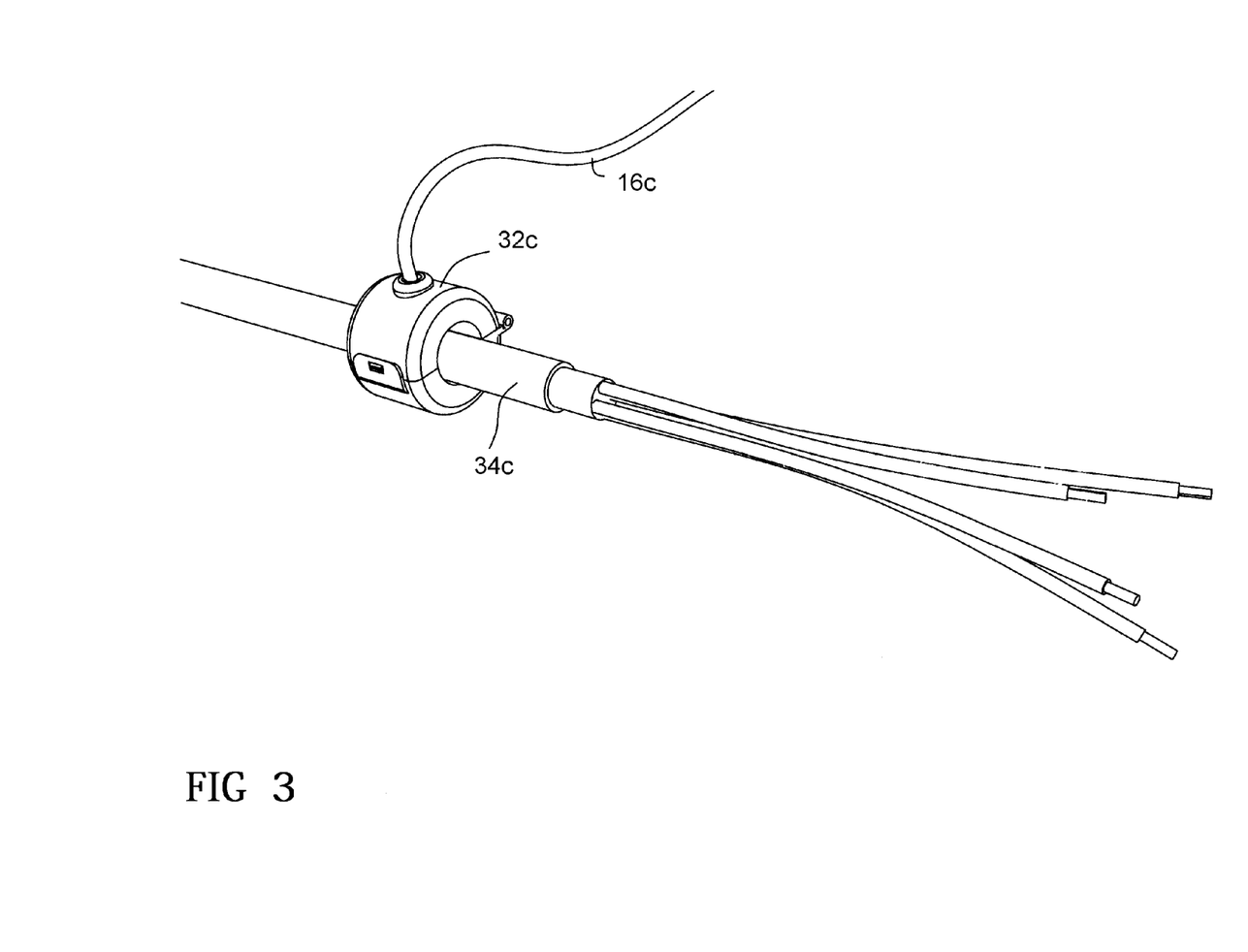
FIG. 3 is a perspective view of one of the induction rings of FIG. 1.

FIG. 3 is a perspective view of one of the induction rings of FIG. 1.

Induction ring 32c is depicted surrounding electric line 34c, for providing measuring line 16c.

Figure 4:
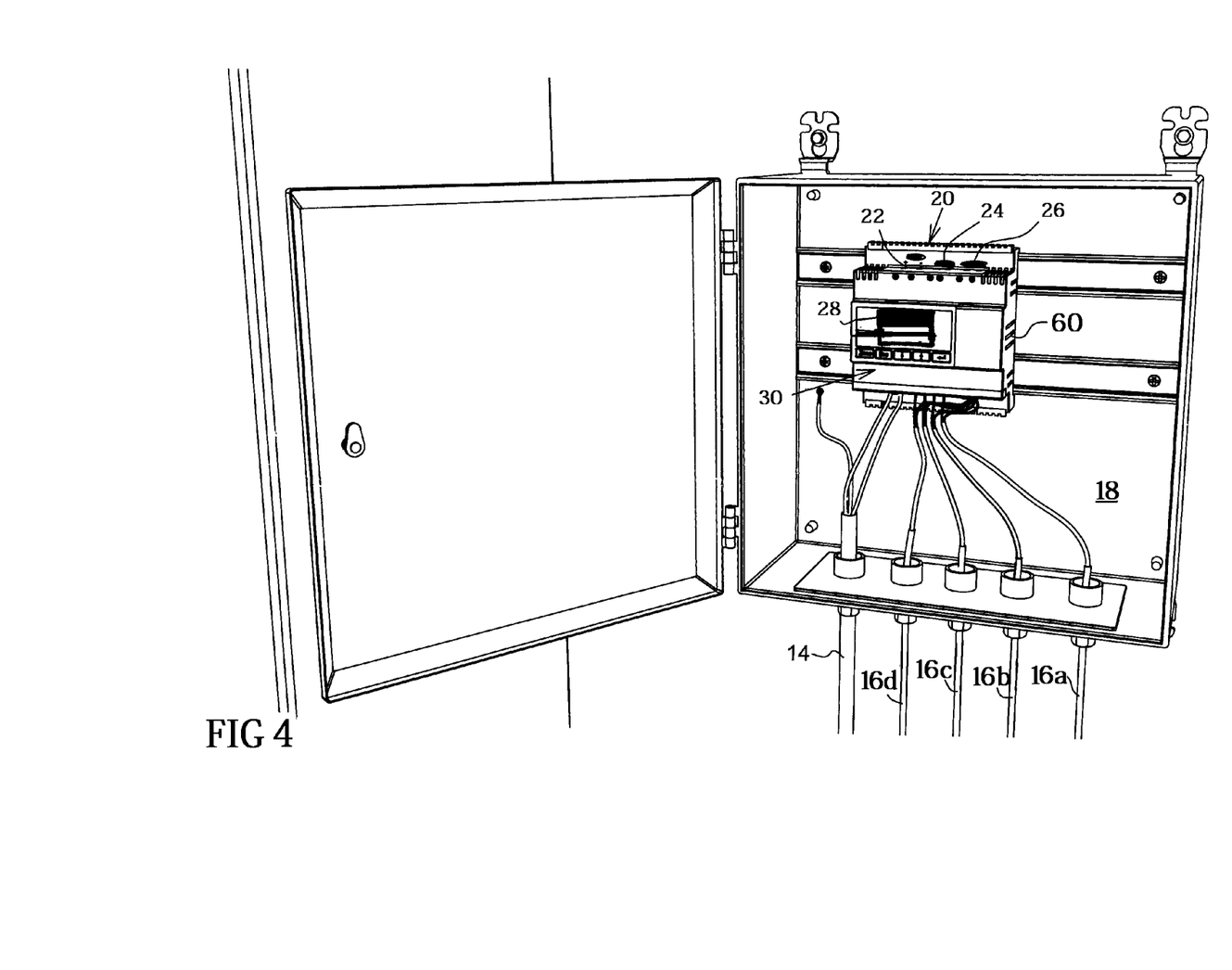
FIG. 4 depicts a shared voltage meter, for measuring different measuring lines of FIG. 1.

FIG. 4 depicts a shared voltage meter 64, for measuring different measuring lines of FIG. 1.

The voltages of measuring lines 16a, 16b and 16c of FIG. 1, are all measured together by the integrated voltage meter 60, being typically a controller, for detecting changes in different measuring lines 16a, 16b and 16c concurrently.

Referring again to FIG. 1, electric lines 34a, 34b and 34c of FIG. 1 constitute the three types available for being measured by induction rings. The first type depicted in FIG. 1, is electric line 34a, being a ground line, of a consumer 52, for being measured by induction ring 32a.

The second type is a single-phase electric line 34b, including the live wire 34bL and the neutral wire 34bN, for example outputted from a single-phase electric source 56 for feeding a one-phase consumer 52. Single-phase electric line 34b is measured by induction ring 32b.

The third type is a three-phase electric line 34c, including the first phase wire 34c1, the second phase wire 34c2, the third phase wire 34c3, and the return wire 34c0, for example outputted from a three-phase electric source 54, for feeding a three-phase consumer 58. The return wire 34c0 carries the complementary current to the other three, for zeroing the overall current. Three-phase electric line 34c is measured by induction ring 32c.

If there is no failure in the electric system 62, then all of the three electric line types 34a, 34b and 34c, must supply zero voltage, and thus integrated volt meter 60 should measure zero voltage in all measured lines 16a, 16b and 16c.

Figure 5:
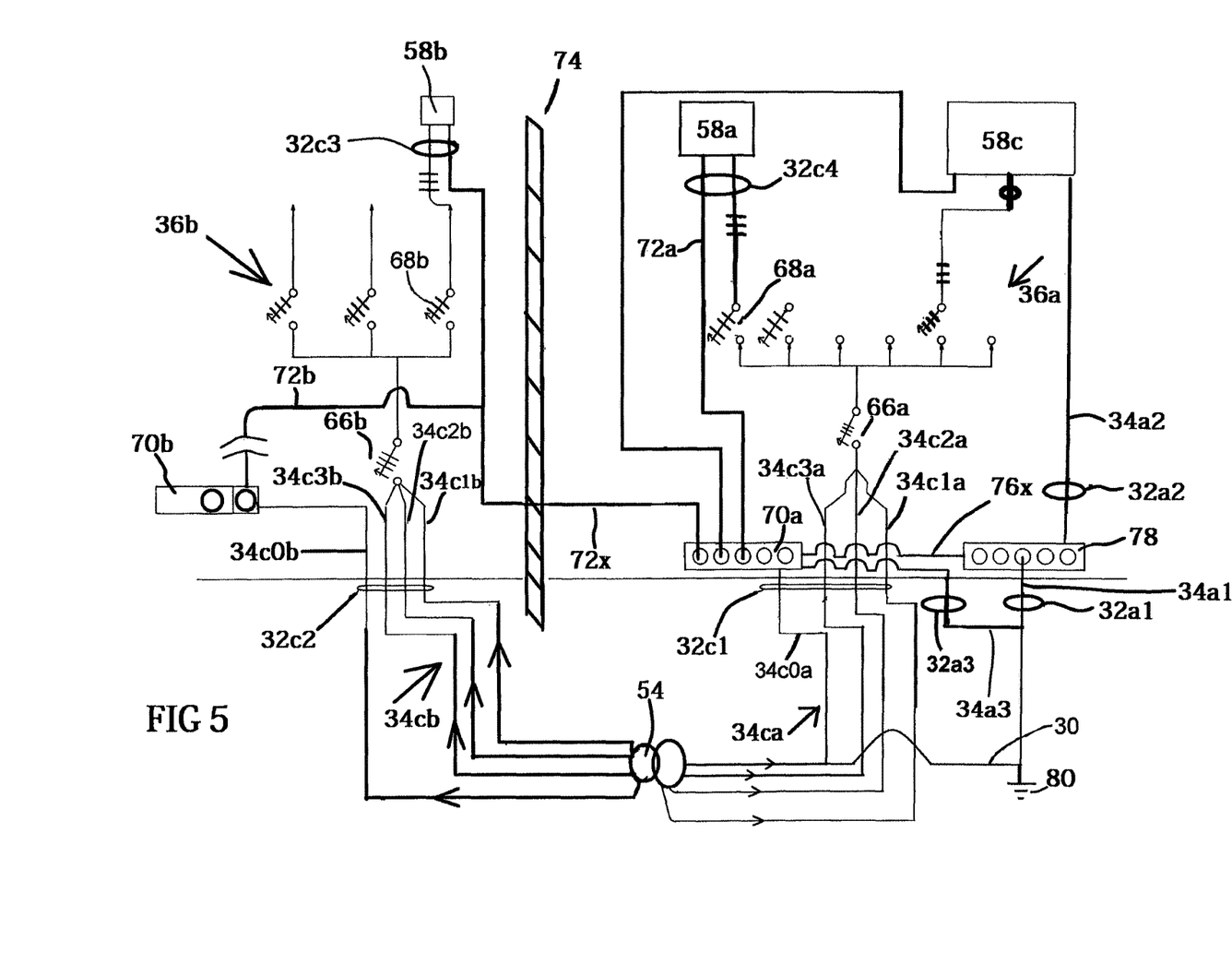
FIG. 5 is a simplified example of a failure, in which the source thereof is traced by two different induction rings.

FIG. 5 is a simplified example of a failure, in which the source thereof is traced by two different induction rings.

The following describes the correct wiring of electricity system 62.

Three-phase power source 54 feeds electric cabinet 36a, for feeding a three-phase consumer 58a through phase wires 34c1a, 34c2a, 34c3a and return wire 34c0a. Phase wires 34c1a, 34c2a, 34c3a are protected by a central three-phase fuse 66a of electric cabinet 36a, and further by a private three-phase fuse 68a of three-phase consumer 58a within electric cabinet 36a. In contrast to phase wires 34c1a, 34c2a, 34c3a, return wire 34c0a is connected to a return busbar 70a, and further, through a wire 72a to the return input of three-phase consumer 58a. Return busbar 70a is shared also by the return wire of another three-phase consumer 58c.

Three-phase power source 54 further feeds electric cabinet 36b, for feeding a three-phase consumer 58b through phase wires 34c1b, 34c2b, 34c3b and return wire 34c0b. Phase wires 34c1b, 34c2b, 34c3b are protected by a central three-phase fuse 66b of electric cabinet 36b, and further by a private three-phase fuse 68b of three-phase consumer 58b within electric cabinet 36b. In contrast to phase wires 34c1b, 34c2b, 34c3b, return wire 34c0b is connected to a return busbar 70b.

The correct wiring is that return wire 34c0b must be connected further to return busbar 70b, through a wire 72b to the return input of three-phase consumer 58b.

A first failure scenario in this example is that the return input of three-phase consumer 58b has been connected to return busbar 70a through a wire 72X, crossing a physical wall 74, which should have been present, between electric cabinets 36a and 36b, instead of to return busbar 70b.

According to this example of failure, induction ring 32c3 measuring the overall current of three-phase consumer 58b, and as well induction ring 32c4 measuring the overall current of three-phase consumer 58a, both measure zero current.

In contrast to induction rings 32c3 and 32c4, induction ring 32c2 measuring the overall current of three-phase power source 54 at the side of three-phase consumer 58b, and as well induction ring 32c1 measuring the overall current of three-phase power source 54 at the side of three-phase consumer 58a, both will measure non-zero currents (in the normal case that the three phases are not balanced).

Thus, electromagnetic radiation detecting system 10 has differentiated between wire 72x and wire 34c0b, and has indicated that the electric cable 34ca including phase wires 34c1a, 34c2a, 34c3a and return wire 34c0a are radiating, and as well cable 34cb including phase wires 34c1b, 34c2b, 34c3b and return wire 34c0b are radiating, and that the electrician must search for the incorrect wiring in the return wire either of three-phase consumer 58a, or 58b or 58c.

The three-phase power source 54 of FIG. 5 may be changed to one-phase power source 56 of FIG. 1; the three-phase consumers of FIG. 5 may be changed to one-phase consumers, like one-phase consumer 52 of FIG. 1; the three-phase fuses of FIG. 5 may be changed to one-phase fuses; and the three-phase wires of FIG. 5 may be changed to one-phase wires of FIG. 1, such that the induction rings of FIG. 5 surround one-phase wires, like induction ring 32b of FIG. 1.

Figure 6:
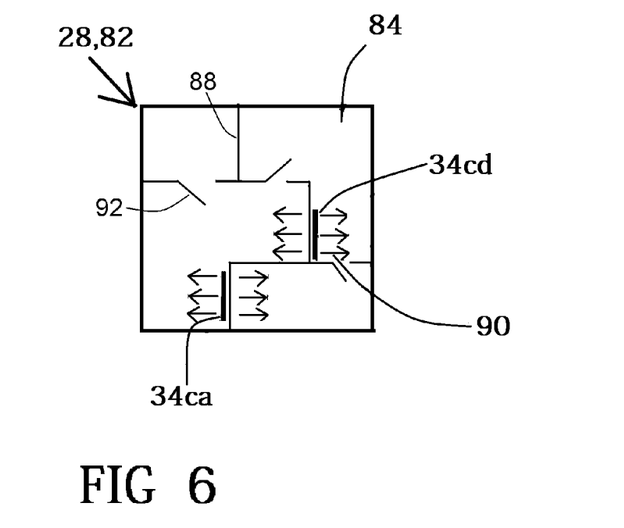
FIG. 6 depicts the contents of the screen of FIG. 4.

FIG. 6 depicts the contents of the screen of FIG. 4.

Numeral 88 denotes a wall in the building, in which a radiating cable may be present. Numeral 92 denotes a door in the building. Numeral 90 denotes the distance from a wall, determined as being radiated by electromagnetic radiation.

Controller 60 of FIG. 4 may include the information of the physical location of each cable, and thus may provide information of the locations where electromagnetic radiation from radiating cables 34ca and 34cb is present, thus indicating unsafe areas for people.

Figure 7:
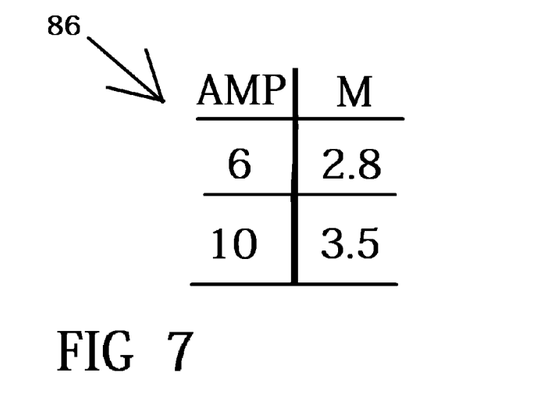
FIG. 7 is a conversion table, for converting the electric measurements to radiated distances.

FIG. 7 is a conversion table, for converting the electric measurements to radiated distances.

The intensity of the measured current may provide, according to a conversion table 86, the distance from the radiating cable, which is considered radiated. For example, 6 amps on cable 34ca recommend moving away 2.8 meters from cable 34ca, 10 amps recommend moving away 3.5 meters, 16 amps recommend moving away 4 meters, and 50 amps recommend moving away 10 meters.

Conversion table 86, for converting the real current on the table to distance, typically will include also the coefficients for converting the measured voltages of the induction rings to the current flowing in the table.

Referring again to FIG. 5, the central grounding 80 is connected, through a cable 30, to the return plug of three-phase power source 54, for providing grounding calibration.

The correct grounding wiring is that the central grounding 80 is connected to the ground busbar 78 of electric cabinet 36a through a wire 34a1, and that the metallic package of three-phase consumer 58c is connected to ground busbar 78 through a wire 34a2. Further, regarding the example that there is no chain of electric cabinets, return busbar 70a must also be connected to central grounding 80 through a wire 34a3.

A second failure scenario example is that return busbar 70a has been connected only to or even also to ground busbar 78 through a wire 76x.

According to this example of failure, induction ring 32a1 measuring the current on wire 34a1, measures non-zero current. Further, induction ring 32c1 will also measure non-zero current, since the return current through wire 34c0a returns therethrough, and also through wire 34a1.

Thus, induction rings 32a1 and 32c1 indicate electromagnetic radiation pollution produced by wires 34a1 and also cable 34ca 1.

Various additional examples may be present, which may be detected by the plurality of induction rings. The plurality of induction rings provide the information to the central controller 60, thus controller 60 is noticed when more than one induction ring has changed from zero to a non-zero reading.

Figure 8:
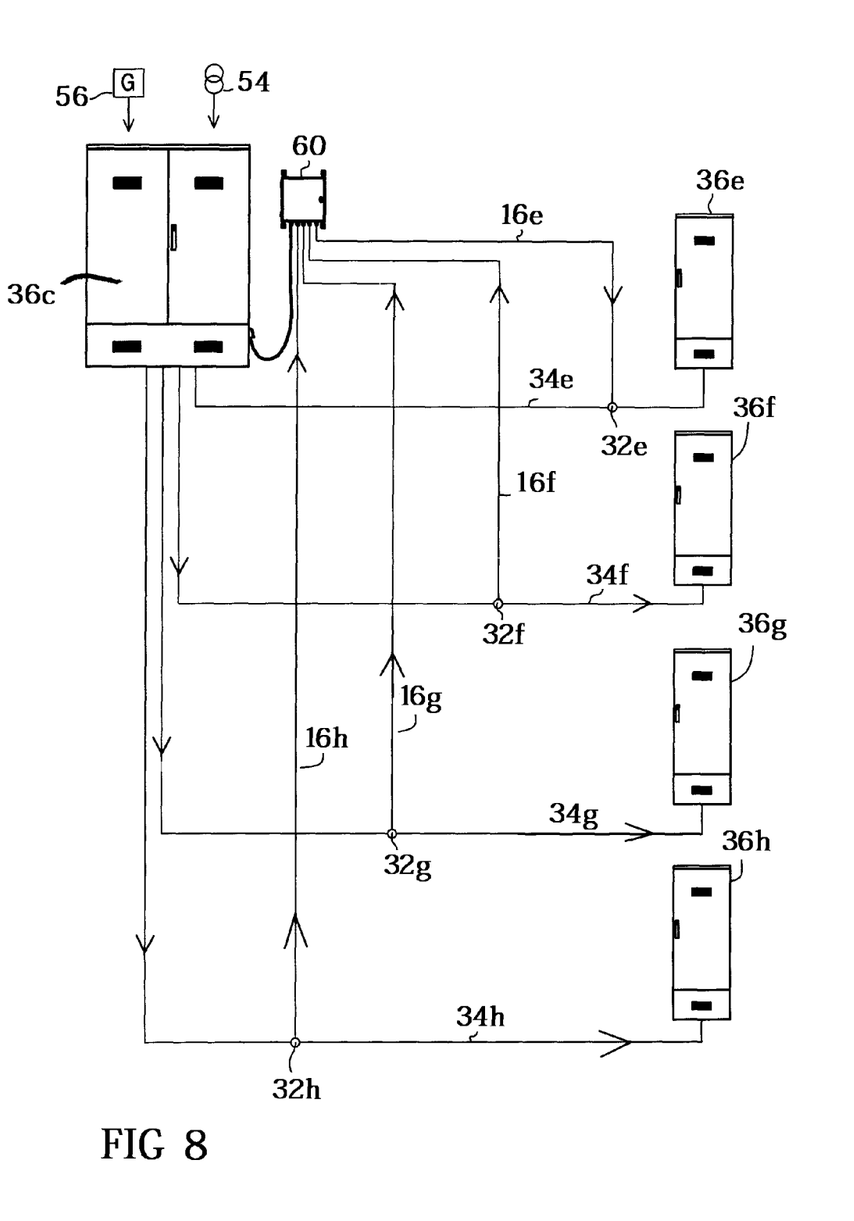
FIG. 8 depicts another electricity system and the electromagnetic radiation detecting system installed thereto.

FIG. 8 depicts another electricity system and the electromagnetic radiation detecting system installed therein.

Figure 9:
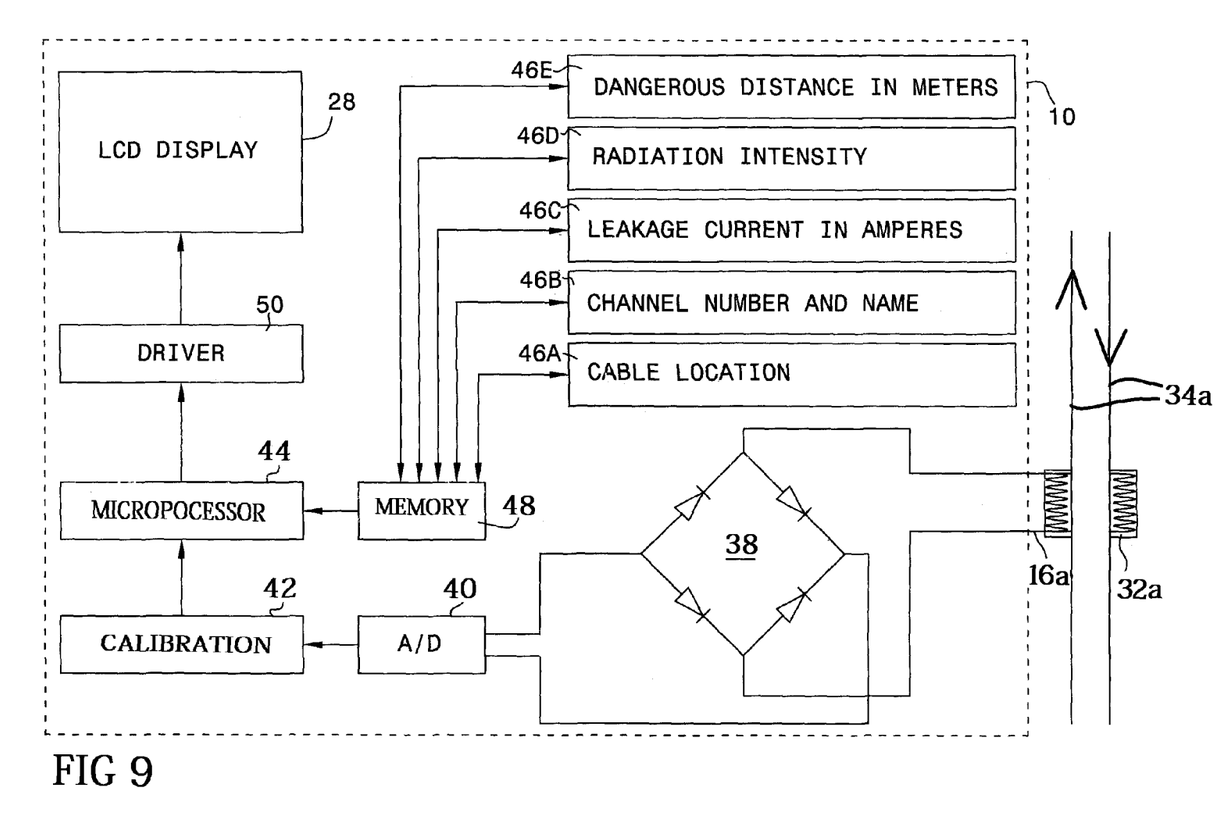
FIG. 9 is a schematic diagram in the form of a flow chart explaining the principle on which the controller works.

FIG. 9 is a schematic diagram in the form of a flow chart explaining the principle on which the controller works.

When electrical current flows on the cable (34a), the induction ring (32a) fitted on the cable senses it, and generates alternating electrical voltage on its coil. This alternating electrical voltage flows on a wire (16a), and enters a bridge rectifier (38), where it is converted from alternating current to direct current.

In the output of the bridge rectifier (38), the direct current enters the signal converter (40), and the direct electric voltage is converted into a digital file. The digital file then enters a component that allows calibration (42), from where it is sent to a microcomputer (44).

The microcomputer is also connected to a memory (48) containing menus and files (46A, 46B, 46C, 46D, 46E) for the microcomputer.

The files from the memory (48) and from the file representing the electrical signal enter the microcomputer (44), are processed, and are sent to the screen driver (50), which displays the information on the controller's screen (28).

Thus, in one aspect, the invention is directed to an electromagnetic radiation detecting system (10) within an electric system (62), the electromagnetic radiation detecting system (10) comprising:
  a plurality of induction rings (32a, 32b, 32c, 32d), each for surrounding one of a plurality of electric lines (34a, 34b, 34c, 34d) of the electric system (62); and
  a controller (60) connected to the plurality of induction rings (32a, 32b, 32c, 32d), for measuring voltages produced by the plurality of induction rings (32a, 32b, 32c, 32d), and
    for indicating, from the measuring, electric lines (34a, 34b, 34c, 34d) corresponding to induction rings (32a, 32b, 32c, 32d) having non-zero sum total electric current flows,
thereby indicating the electric lines (34a, 34b, 34c) as being electromagnetic radiation sources.

The electromagnetic radiation detecting system (10) may further comprise:
  a map (82) comprising physical locations of the electric lines (34a, 34b, 34c, 34d) of the electric system (62) within the structure (84),
thereby indicating physical locations of the electric lines (34a, 34b, 34c, 34d) being the electromagnetic radiation pollution sources.

The electromagnetic radiation detecting system (10) may further comprise:
  a conversion table (86), for determining the radiated distance (90) for each of the induction rings (32a, 32b, 32c, 32d) having non-zero sum total electric current flows, as a function thereof,
thereby indicating physical distances from the electric lines (34a, 34b, 34c, 34d) as being electromagnetic radiated.

Each of the electric lines (34a, 34b, 34c, 34d) being surrounded may comprise one of:
  a ground line (34a); or
  a one-phase electric line (34b), consisting of a live wire (34bL) and of a neutral wire (34bN); or
  a three-phase electric line (34c), consisting of a first phase wire (34c1), of a second phase wire (34c2), of a third phase wire (34c3), and of a return wire (34c0) of the first (34c1), second (34c2) and third (34c3) phase wires,
thereby for correct wiring of the electric system (62), all of the plurality of induction rings (32a, 32b, 32c, 32d) should produce zero voltages.

The controller (60) connected to the plurality of induction rings (32a, 32b, 32c, 32d), may be capable of concurrent detection of non-zero voltages produced by at least two induction rings (32c1, 32c2) concurrently, thereby associating a single wiring failure (72x) to the at least two detected induction rings (32c1, 32c2), thereby accomplishing tracing of failed wiring (72x).

In another aspect, the invention is directed to a method for detecting electromagnetic radiation within an electric system (62), the method comprising the steps of:
  surrounding electric lines (34a, 34b, 34c, 34d) of the electric system (62), each by an induction ring (32a, 32b, 32c, 32d);
  measuring voltages produced by the plurality of induction rings (32a, 32b, 32c, 32d);
  indicating, from the measuring, electric lines (34a, 34b, 34c, 34d) corresponding to the induction rings (32a, 32b, 32c, 32d) having non-zero sum total electric current flows,
thereby indicating the electric lines (34a, 34b, 34c, 34d) as being electromagnetic radiation pollution sources.

The method may further comprise the step of:
  mapping physical locations of the electric lines (34a, 34b, 34c, 34d) of the electric system (62) within the structure (84); and
  indicating physical locations of the electric lines (34a, 34b, 34c, 34d) being the electromagnetic radiation pollution sources.

The method may further comprise the step of:
  converting each of the non-zero measured voltages, produced by the induction rings (32a, 32b, 32c, 32d), to a distance (90),
  thereby indicating physical distances from the electric lines (34a, 34b, 34c, 34d) as being electromagnetic radiated.

The steps of measuring the voltages and of indicating the electric lines (34a, 34b, 34c, 34d) corresponding to the induction rings (32a, 32b, 32c, 32d) having non-zero sum total electric current flows, may comprise: concurrent measuring and indicating of at least two of the plurality of induction rings (32a, 32b, 32c, 32d) having the non-zero sum total electric current flows, thereby associating a single wiring failure (72x) to the at least two detected induction rings (32c1, 32c2), thereby accompanying tracing the failed wiring (72x).

In the figures and/or description herein, the following reference numerals (Reference Signs List) have been mentioned:

numeral 10 denotes an electromagnetic radiation detecting system, according to one embodiment of the invention;

numeral 14 denotes an electric cable;

numerals 16a, 16c, 16c, 16d, 16e, 16f, 16g and 16h each denotes a measuring line being the ends of an induction ring;

numeral 18 denotes an electric box, for packaging the controller;

numeral 20 denotes the upper part of the controller;

numeral 22 denotes a relay outlet of the controller, used for connecting to an external siren;

numeral 24 denotes a relay outlet of the controller, used for dialing report cases of a radiating cable;

numeral 26 denotes a relay outlet of the controller, allowing connection of a dry contact electrical connection to be operated in case of a radiating cable;

numeral 28 denotes the screen of the controller;

numeral 30 denotes the cable between the power source and the central grounding;

numerals 32a, 32b, 32c, 32d, 32e, 32f, 32g, 32h, 32a1, 32a2, and 32a3 denote induction rings, each for surrounding one electric cable;

numerals 34a, 34b, 34c, 34d, 34e, 34f, 34g, 34h, 34a1, 34a2, and 34a3 denote electric wires and cables, being electric lines, being examined by the radiation detecting system;

numerals 36a, 36b, 36c, 36d, 36e, 36f, 36g, and 36h denote electric cabinets; numeral 38 denotes a rectifier;

numeral 40 denotes an analog to digital converter;

numeral 42 denotes a calibrating component;

numeral 44 denotes a micro-computer;

numerals 46A, 46B, 46C, 46D, and 46E denote menus and files within the controller;

numeral 48 denotes a memory of the controller;

numeral 50 denotes a screen driver;

numeral 52 denotes a one-phase consumer;

numeral 54 denotes a three-phase electric source;

numeral 56 denotes a one-phase electric source;

numeral 58a, 58b and 58c denote three-phase consumers;

numeral 60 denotes a controller, including a plurality of volt meters and additional functions; the volt meter is enumerated 64;

numeral 62 denotes electricity system, typically including a plurality of electric cabinets, for feeding a plurality of consumers; the electricity system is typically powered by more than one power source, typically for backup;

numerals 66a and 66b denote central three-phase fuses disposed within the electric cabinets;

numerals 68a, 68b denote private (e.g., dedicated to a certain consumer) three-phase fuses disposed within the electric cabinets;

numerals 70a and 70b denotes return busbars;

numerals 72a, 72b denote correctly wired wires;

numeral 72x denotes a non-correctly wired wire;

numeral 74 denotes a physical wall, which may be disposed within an electric cabinet, for not allowing connecting wires from one side of the wall to another side thereof;

numeral 76x denotes another non-correctly wired wire;

numeral 78 denotes a ground busbar in an electric cabinet, to which all the ground plugs associated to the electric cabinet, are to be connected;

numeral 80 denotes the central grounding, to which all ground busbars are to be connected;

numeral 82 denotes a map of the wiring of the electric system; the map may be available in the memory of the controller;

numeral 84 denotes a structure, such as a building or campus, in which the electric system is deployed;

numeral 86 denotes a conversion table, for obtaining the radiated distance from the measurements of the induction rings. The conversion table starts from the voltage measured across the induction ring; converts it to the current flowing across the electric line surrounded by the induction ring; and converts the current to distance being radiated;

numeral 88 denotes a wall in the building;

numeral 90 denotes the distance determined as being radiated by electromagnetic radiation; and numeral 92 denotes a door in the building.

The foregoing description and illustrations of the embodiments of the invention has been presented for the purposes of illustration. It is not intended to be exhaustive or to limit the invention to the above description in any form.

Any term that has been defined above and used in the claims, should to be interpreted according to this definition.

The reference numbers in the claims are not a part of the claims, but rather used for facilitating the reading thereof. These reference numbers should not be interpreted as limiting the claims in any form.

What is claimed is:

1. An electromagnetic radiation detecting system within an electric system, said electromagnetic radiation detecting system comprising:
    at least two induction rings, each for surrounding one of a plurality of electric lines of said electric system, wherein each of said surrounded electric lines comprises one or more wires; and
    a controller connected to said at least two induction rings,
        for concurrently measuring voltages produced by said at least two induction rings,
        for indicating, from said measured voltages, the correct wiring of said one or more of said plurality of electric lines corresponding to said at least two induction rings producing said measured voltages, dependent on a sum of total electric current flows,
        wherein when said one or more of said plurality of electric lines indicates a zero sum total electric current flow, said zero indication relates to correctly connected wiring thereof,
        and wherein when said one or more of said plurality of electric lines indicates a non-zero sum total electric current flow, said non-zero indication relates to a single wiring failure of at least two non-correctly connected electric lines,
    said non-zero indication thereby accomplishing tracing of electromagnetic radiation pollution sources in the electric system, by associating said single wiring failure with said at least two induction rings.

2. An electromagnetic radiation detecting system according to claim 1, further comprising:
    a map comprising physical locations of said plurality of electric lines of said electric system within a structure, thereby indicating physical locations of said one or more of said plurality of electric lines being the electromagnetic radiation pollution sources.

3. An electromagnetic radiation detecting system according to claim 1, further comprising:

a conversion table, for determining a radiated distance for each of said plurality of induction rings having non-zero sum total electric current flows, as a function thereof, thereby indicating physical distances from said one or more of said plurality of electric lines as being electromagnetic radiated.

4. An electromagnetic radiation detecting system according to claim 1, wherein each of said plurality of electric lines being surrounded comprises an electric line selected from a group consisting of:
   a ground line;
   a one-phase electric line, consisting of a live wire and of a neutral wire;
   a three-phase electric line, consisting of a first phase wire, of a second phase wire, of a third phase wire, and of a return wire of said first, second and third phase wires,
thereby for correct wiring of the electric system, all of said plurality of induction rings produce zero voltages.

5. A method for detecting electromagnetic radiation within an electric system, said method comprising the steps of:
   surrounding at least two of a plurality of electric lines of said electric system, each by an induction ring, wherein each of said surrounded electric lines comprises one or more wires;
   concurrently measuring voltages produced by at least two of said induction rings;
   indicating, from said measured voltages, the correct wiring of one or more of said plurality of electric lines corresponding to said at least two induction rings producing said measured voltages, dependent on a sum total of electric current flows,
   wherein when said one or more of said plurality of electric lines indicates a zero sum total electric current flow, said zero indication relates to correctly connected wiring thereof,
   and wherein when said one or more of said plurality of electric lines indicates a non-zero sum total electric current flow, said non-zero indication relates to a single wiring failure of at least two non-correctly connected electric lines,
   said non-zero indication thereby accomplishing tracing of electromagnetic radiation pollution sources in the electric system, by associating said single wiring failure with said at least two induction rings.

6. A method according to claim 5, further comprising the step of:
   mapping physical locations of said plurality of electric lines of said electric system within a structure; and
   indicating physical locations of said one or more of said plurality of electric lines being the electromagnetic radiation pollution sources.

7. A method according to claim 5, further comprising the step of:
   converting each of said non-zero measured voltages, produced by said plurality of induction rings, to a distance,
thereby indicating physical distances from said one or more of said plurality of electric lines as being electromagnetic radiated.

* * * * *